(12) United States Patent
Lee et al.

(10) Patent No.: US 6,756,671 B2
(45) Date of Patent: Jun. 29, 2004

(54) MICROELECTRONIC DEVICE WITH A REDISTRIBUTION LAYER HAVING A STEP SHAPED PORTION AND METHOD OF MAKING THE SAME

(75) Inventors: Chu-Sheng Lee, Shanhua Jen (TW); Chu-We Hu, Taichung (TW); Yu-Lung Yeh, Chiu Kaohsiung (TW); Sheng-Hung Chou, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/190,274

(22) Filed: Jul. 5, 2002

(65) Prior Publication Data

US 2004/0004284 A1 Jan. 8, 2004

(51) Int. Cl.⁷ ............................................. H01L 23/48
(52) U.S. Cl. ...................... 257/737; 257/739; 257/765; 257/773
(58) Field of Search ................................. 257/737, 739, 257/762, 765, 773; 438/613, 668, 618

(56) References Cited

U.S. PATENT DOCUMENTS

| | | | | |
|---|---|---|---|---|
| 4,290,079 A | * | 9/1981 | Carpenter et al. | 257/780 |
| 6,287,893 B1 | * | 9/2001 | Elenius et al. | 438/108 |
| 6,379,993 B1 | * | 4/2002 | Nakano et al. | 438/75 |

* cited by examiner

Primary Examiner—Nathan J. Flynn
Assistant Examiner—Leonardo Andujar
(74) Attorney, Agent, or Firm—Tung & Associates

(57) ABSTRACT

A method of making a microelectronic device providing a base substrate having a bond pad, a first passivation layer overlying the base substrate and a portion of the bond pad, and a second passivation layer overlying the first passivation layer; forming a first sacrificial layer over the second passivation layer, wherein the first sacrificial layer includes an opening therethrough; etching the exposed portion of the second passivation layer to provide a recess therein; trimming a portion of the first sacrificial layer to enlarge the opening; etching the exposed portion of the second passivation layer to provide an enlarged recess and a first riser, a second tread, a second riser and a second tread; removing the first sacrificial layer; depositing a redistribution layer into the enlarged recess in the second passivation layer and over the first riser, first tread, second riser, and second tread.

9 Claims, 5 Drawing Sheets

MICROELECTRONIC DEVICE WITH A REDISTRIBUTION LAYER HAVING A STEP SHAPED PORTION AND METHOD OF MAKING THE SAME

FIELD OF THE INVENTION

This invention relates to microelectronic devices, and more particularly, to a microelectronic device such as a wafer level chip scale package having a retribution layer with a step or staircase shaped portion and a method of making the same.

BACKGROUND OF THE INVENTION

It is known to make microelectronic conductor devices, such as semiconductor devices, using a redistribution layer to connect a bond pad and a solder bump that are laterally spaced apart. One such device is a wafer level chip scale package (WLCSP). From a manufacturing point of view, a WLCSP is just an improved version of a traditional solder-bumped flip chip, except that the solder bumps on a WLCSP are much larger, the printed circuit board assembly of a WLCSP is more robust, and the manufacture usually does not have to struggle with an underfill encapsulant. WLCSP and flip chip manufacture share common components and techniques, particularly solder bumping. A brief discussion of flip chip technology will be helpful in understanding the present invention which primarily relates to semiconductor devices having a redistribution layer connected to a solder bump such as WLCSP.

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

In fabricating a flip-chip bond structure, the fabrication process requires a tight control of interface processes and manufacturing parameters in order to meet very small dimensional tolerances. Various techniques may be utilized to fabricate a UBM structure and to deposit the solder bump.

A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer such as $SiO_2$, via holes are then etched through the wafer passivation layer to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350° C. to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflown in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. A photoresist layer is deposited over the UBM. The portions of the UBM are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

One of the most cost-effective packaging techniques is known as direct chip attach wherein a solder bumped flip chip is directly attached to a printed circuit board. However, due to the thermal expansion mismatch between the silicon chip and the printed circuit board (made from an epoxy or fiberglass material), an underfill encapsulant is usually needed for solder joint reliability. Due to the underfill operation, the manufacturing costs is increased in the manufacturing throughput is often substantially reduced. Further, reworking an underfill flip chip on a printed circuit board is practically impossible.

Another drawback of direct chip attach type microelectronic packaging techniques has to do with the pitch and size of the pads on the peripheral-arrayed chip. For direct chip attached assemblies, the bond pads are very small and result in high demand on the underlying printed circuit board.

Wafer level chip scale packages provide advantages over direct chip attached assemblies. In a wafer level chip scale package, a metal layer is used to redistribute the very fine pitched peripheral arrayed pads on the chip to much larger pitch area arrayed pads located in the interior portion of the upper face of the chip where larger solder joints may be provided for connection to the printed circuit board. Thus, the demands on the printed circuit board are much more relaxed using the wafer level chip sale packages.

FIG. 1 illustrates a wafer level chip scale package 100 including a square chip 112, which may be for example, approximately 9.64 by 9.64 mm. The integrated circuit chip 112 includes a silicon base with discrete devices formed therein and metal interconnects overlying the discrete devices in a manner known to those skilled in the art. A plurality of peripheral-arrayed bond pads 114 are provided over the metal interconnects. For example, the bond pads 114 typically may have a size of about 0.1 mm. by 0.1 mm and may be positioned with respect to each other at a pitch of about 0.25 mm. A metal layer or electrically conductive redistribution traces 116 are deposited on top of the wafer to redistribute the fine-pitched peripheral-arrayed bond pads 114 to a much larger pitch area-arrayed pads in the interior of the chip onto which larger solder bump connections 118 are provided. For example, the solder bump connections 118 may be formed on a redistribution pads having a pitch of about 0.75 and a pad size of about 0.3 mm in diameter.

FIG. 2 illustrates a portion of a prior art semiconductor device 10 such as a high speed analog device. The semiconductor device 10 includes a silicon based wafer or substrate 12 that includes a silicon base (not separately shown) that includes background doping and selective doping to define discrete semiconductor devices or structures. The semiconductor device 10 may include a plurality of alternating dielectric and metal layers overlying the silicon base in a manner known to those skilled in the art. One of the metal layers may be a bond pad or top metal layer 14. A first passivation layer such as a silicon nitride layer 16 may overlie the plurality of alternating dielectric and metal layers. The high speed analog device requires a relatively thick dielectric layer 18 to reduce signal interference. A relatively thick (approximately 3 μm thick) dielectric layer 18 may overlie the first passivation layer 16, and an opening or via may be formed through the relatively thick dielectric layer 18 and the first passivation layer 16 so that the via is positioned over the top metal layer 14. The via may be defined by at least one relatively straight vertical side wall 19 of the relatively thick dielectric layer 18. An electrically conductive redistribution layer 20 may be provided having a portion in electrical contact with the top metal layer 14 and having another portion in electrical contact with an electrically conductive bump 26, such as a solder bump. An under bump metallurgy 24 may be interposed between the solder bump 26 and the redistribution layer 20. However, because the dielectric layer 18 is relatively thick, the electrically conductive redistribution layer 20 includes a relatively thin portion 28 along the side wall 19 of the dielectric layer 18. The relatively thin portion 28 of the electrically conductive redistribution layer 20 is prone to failure, particularly when the aspect ratio of the via is about 1 or greater. Thus there is a need for semiconductor devices with reliable electrically conductive redistribution layers and methods of making the same. The present invention satisfies this need in the prior art.

SUMMARY OF THE INVENTION

One embodiment of the invention includes a microelectronic device including a base substrate having a bond pad; and an electrically conductive redistribution layer having a portion electrically connected to the bond pad and having a staircase shaped portion adjacent bond pad, and wherein the stair shaped portion includes at least two steps and wherein each step includes a riser and a tread.

In another embodiment of the invention the microelectronic device further includes an electrically conductive bump electrically connected to another portion of the redistribution layer.

In another embodiment of the invention the microelectronic device further includes a passivation layer overlying the base substrate including a staircase shaped portion underlying the stair shaped portion of the redistribution layer.

In another embodiment of the invention the electrically conductive bump comprises solder.

In another embodiment of the invention the microelectronic device further includes an under bump metallurgy interposed between the electrically conductive bump and the other portion of the redistribution layer.

In another embodiment of the invention the microelectronic device further includes a passivation layer overlying the redistribution layer.

In another embodiment of the invention the passivation layer overlying the redistribution layer includes a recess therein, and the microelectronic device further includes the planarizing layer overlying the passivation layer that overlies the redistribution layer.

In another embodiment of the invention the microelectronic device further includes an under bump metallurgy interposed between the electrically conductive bump and the other portion of the redistribution layer and the under bump metallurgy extending through the planarizing layer and the passivation layer overlying the redistribution layer.

In another embodiment of the invention the base substrate comprises a semiconductor wafer.

Another embodiment of the invention includes a method of making a microelectronic device including providing a base substrate having a bond pad, a first passivation layer overlying the base substrate and at least a portion of the bond pad, and a second passivation layer overlying the first passivation layer; forming a first sacrificial layer over the second passivation layer, and wherein the first sacrificial layer includes an opening therethrough aligned with the bond pad; and etching the exposed portion of the second passivation layer to provide a recess therein; trimming a portion of the sacrificial layer to enlarge the opening therein; and etching the exposed portion of the second passivation layer to provide an enlarged recess therein and a first riser, a first tread, a second riser and a second tread defined in the second passivation layer; removing the first sacrificial layer; and depositing an electrically conductive redistribution layer over the first riser, the first tread, the second riser, and the second tread.

Another embodiment of the invention further includes depositing a third passivation layer over the redistribution layer.

Another embodiment of the invention further includes forming an opening in the third passivation layer down to the redistribution layer and depositing an under bump metallurgy in the opening in the third passivation layer so that the under bump metallurgy is electrically connected to the redistribution layer, and forming an electrically conductive bump over the under bump metallurgy.

In another embodiment of the invention the third passivation layer includes a recess therein, and further including depositing a planarization layer over the third passivation layer, and further including forming an opening in the planarization layer and the third passivation layer down to the redistribution layer and depositing an under bump metallurgy in the opening through the planarization layer and the third passivation layer so that the under bump metallurgy is electrically connected to the redistribution layer, and forming an electrically conductive bump over the under bump metallurgy.

In another embodiment of the invention the planarization layer includes a polyamide material.

In another embodiment of the invention the third passivation layer comprises silicon dioxide.

In another embodiment of the invention the second passivation layer comprises silicon dioxide.

In another embodiment of the invention the first passivation layer comprises silicon nitride.

In another embodiment of the invention the redistribution layer comprises aluminum.

In another embodiment of the invention the redistribution layer comprises copper.

In another embodiment of the invention the redistribution layer comprises aluminum and copper.

In another embodiment of the invention the bond pad comprises copper.

In another embodiment of the invention the electrically conductive bump comprises solder.

In another embodiment of the invention the etching of the second passivation layer comprises anisotropically etching.

In another embodiment of the invention the etching of the second passivation layer comprises anisotropically etching to produce the riser with the substantially vertical profile.

In another embodiment of the invention the etching of the second passivation layer comprises anisotropically etching to produce the riser with the tapered profile.

In another embodiment of the invention the etching of the second passivation layer comprises reactive ion etching.

In another embodiment of the invention the reactive ion etching is accomplished using the $CF_4$.

In another embodiment of the invention the trimming of the first sacrificial layer comprises etching a portion of the first sacrificial layer.

In another embodiment of the invention the trimming a first sacrificial layer comprises isotopically etching with ozone.

Another embodiment of the invention further includes repeatedly trimming the first sacrificial layer and etching the second passivation layer so that a via extends through the second passivation layer down to the bond pad, and wherein the redistribution layer is deposited so as to be in electrical contact with bond pad, and wherein the staircase shaped portion of the redistribution layer extends from the bond pad.

These and other objects, features and advantages of the present invention will become apparent from the following brief description of the drawings, detailed description of the preferred embodiments, and appended claims and drawings.

DETAILED DESCRIPTION OF THE PREFERRED EMBODIMENTS

Figure 1:
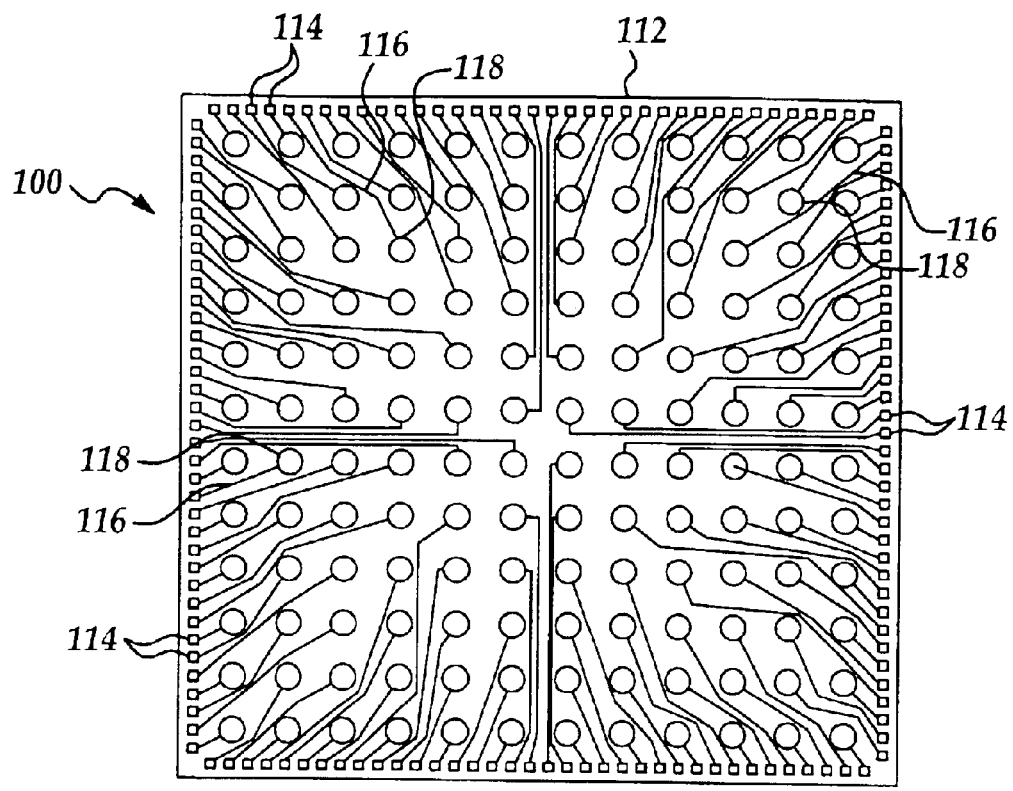
FIG. 1 illustrates a prior art wafer chip scale package.
Figure 2:
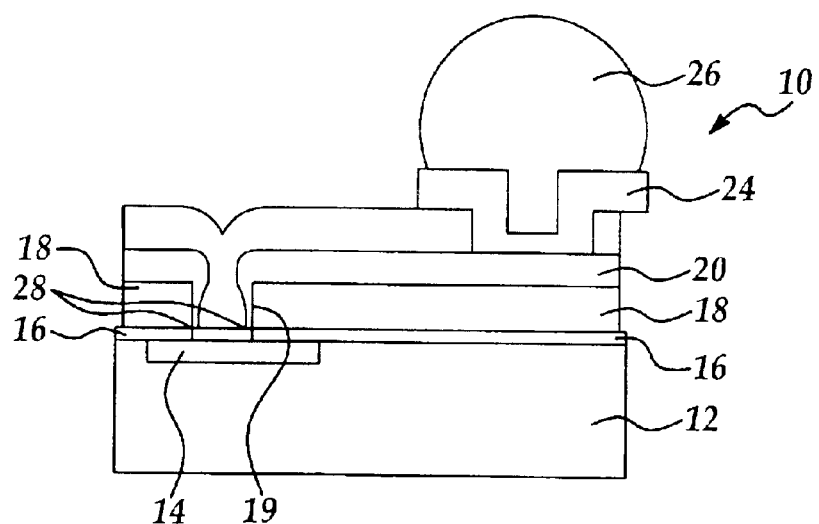
FIG. 2 illustrates a prior art semiconductor device.
Figure 3A:
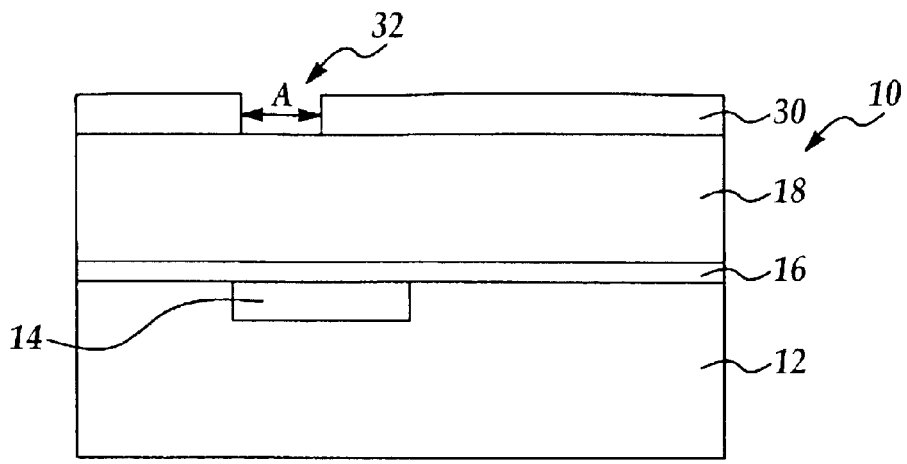
FIG. 3A illustrates forming a sacrificial layer with an opening therein over a passivation layer overlying a base substrate according to the present invention.
Figure 3B:
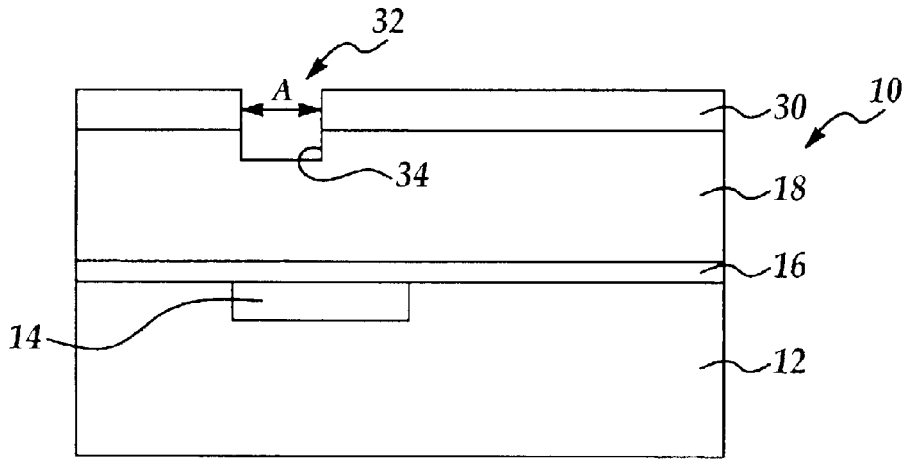
FIG. 3B illustrates the etching of a passivation layer according to the present invention.

FIGS. 3A–J illustrate a method of making a microelectronic device according to the present invention. As shown in FIG. 3A, a base substrate 12 is provided which may include a silicon base semiconductor chip or wafer portion and a plurality of alternating dielectric and metal interconnect layers overlying the same and including an upper metal layer that may have a bond pad 14. The base substrate 12 may also be any of a variety of other structure known to those skilled in the art including, but not limited to, ceramic and organic based substrates. A first passivation layer 16 is provided over the base substrate 12 and at least a portion of the bond pad 14. As shown in FIG. 3A the first passivation layer 16 completely covers the bond pad 14, but in an alternative embodiment, the first passivation layer 16 may have an opening formed therein which overlies the bond pad 14. Preferably the first passivation layer is a silicon nitride based material. A second passivation layer 18 overlies the first passivation layer 16 and preferably is a silicon dioxide material. A sacrificial layer 30 such as a photoresist that is then patterned and developed to provide an opening 32 therein is formed over the second passivation layer 18. The opening 32 is aligned with the bond pad 14 and has a cross-sectional area that is at least defined in part by the width or diameter of the opening designated by line A. The opening 32 may be any of a variety of configurations such as square, or rectangular, circular or elliptical in cross-section or configuration. The exposed area of the second passivation layer 18 is etched to provide a cutaway area in the second passivation layer 18 that is defined at least in part by a side wall 34. The second passivation layer 18 may be etched by any of a variety of methods known to those skilled in the art such as using wet etching or preferably reactive ion etching with $CF_4$. The side wall 34 wall formed in the second passivation layer 18 constitutes a first riser of a first step to be defined in the second passivation layer 18 as will be described hereafter.

Figure 3C:
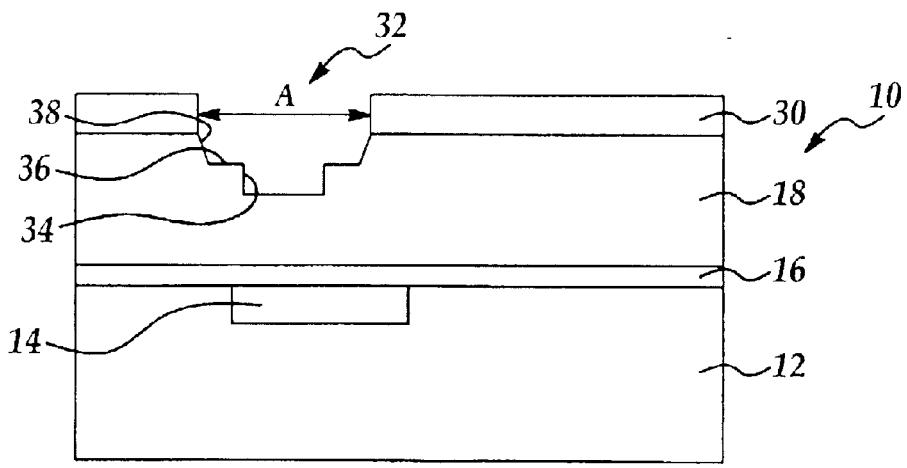
FIG. 3C illustrates a first trimming of the sacrificial layer to enlarge the opening and etching the newly exposed portion of the passivation layer according to the present invention.

Thereafter, as shown in FIG. 3C, the sacrificial layer 30 is trimmed so that the opening 32 is enlarged. The opening 32 has a greater cross-sectional area (defined at least in part by line A) than the opening shown of FIG. 3B. The sacrificial layer 30 (preferably a photoresist layer) may be trimmed by any manner known to those skilled in the art. For example the sacrificial layer 30 may be trimmed using a partial isotropic etch such as reactive ion etching with ozone, or laser trimming. The newly exposed area of the second passivation layer 18 is etched preferably in the same manner as described with respect to FIG. 3B. The etching produces a first tread 36 and a second riser 38. The first trend 36 extends generally in a perpendicular direction to the first riser 34. Preferably the etching technique utilized is anisotropic producing risers that have a vertical wall profile or a slightly tapered wall profile.

Figure 3D:
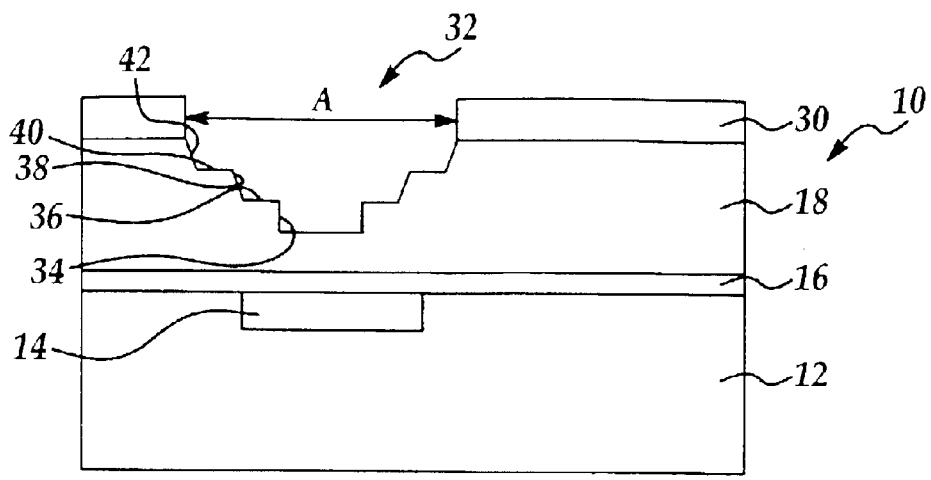
FIG. 3D illustrates a second trimming of the sacrificial layer to further enlarge the opening and etching the newly exposed portion of the passivation layer according to the present invention.
Figure 3E:
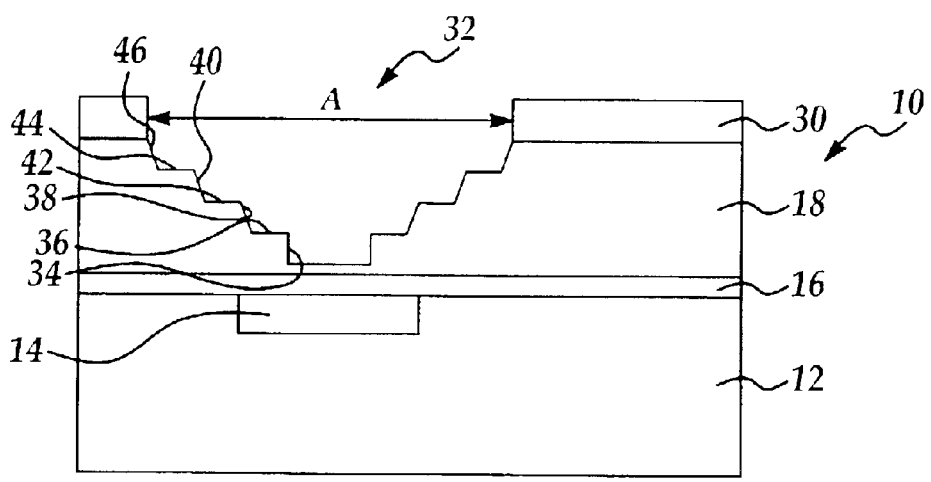
FIG. 3E illustrates a fourth trimming of the sacrificial layer to still further enlarge the opening therein and etching the newly exposed portion the passivation layer according to the present invention.
Figure 4A:
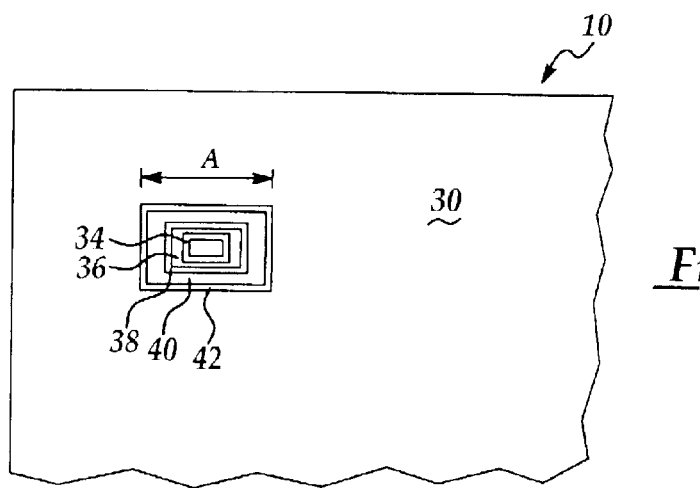
FIG. 4A illustrates the opening formed in the first sacrificial layer corresponding to FIG. 3D.
Figure 4B:
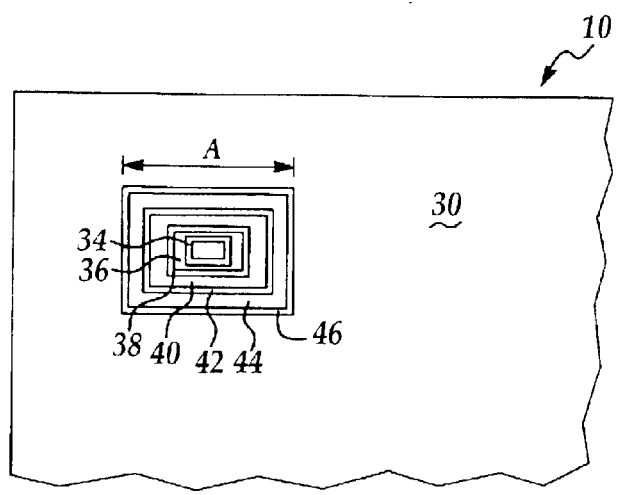
FIG. 4B illustrates the opening formed in the first sacrificial layer corresponding to FIG. 3E.

As shown in FIG. 3D, the sacrificial layer 30 (photoresist layer) is trimmed again so that the opening 32 has a cross-sectional area (defined at least by line A) that is greater than the opening 32 shown in FIG. 3C. The exposed area of the second passivation layer 32 is again etched in a similar manner to produce a second tread 40 and a third riser 42. As shown in FIG. 3E, the sacrificial layer 30 is again trimmed to provide an opening 32 therein (defined at least in part by line A) which is greater than the opening 32 shown in FIG. 3D. The exposed portion of the second passivation layer 18 is again etched to provide a third tread 44 and a fourth riser 46. FIGS. 4A and 4B are top or plan views of FIGS. 3D and 3E illustrating the enlargement of the opening 32 in the sacrificial layer 30 caused by trimming the same.

Figure 3F:
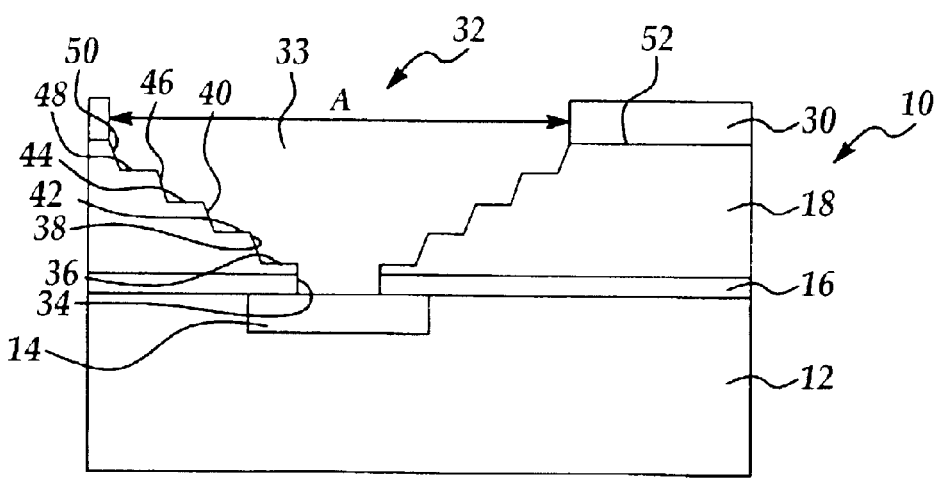
FIG. 3F illustrates a fifth trimming of the sacrificial layer to still further enlarge the opening therein and etching the newly exposed portion the passivation layer to provide at least one wall having a staircase shaped portion including a plurality of the steps each having a riser and tread according to the present invention.
Figure 3G:
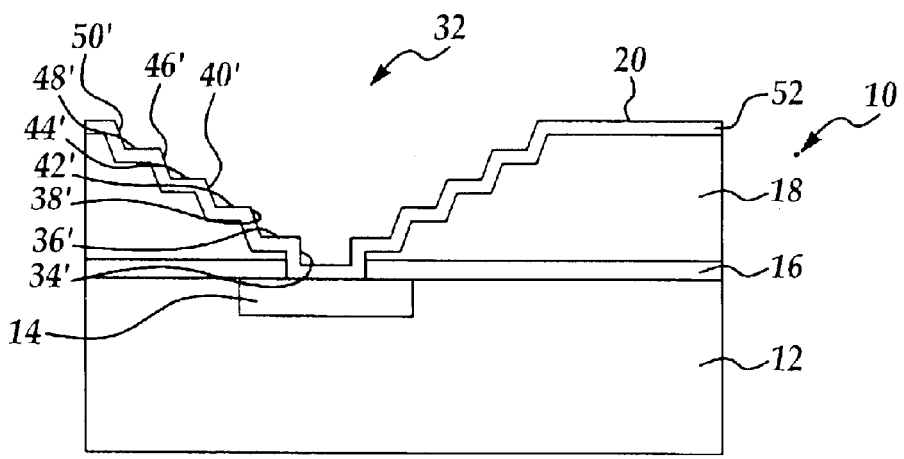
FIG. 3G illustrates depositing an electrically conductive redistribution layer into the opening in the second passivation layer overlying the bond pad and over the plurality of the steps to provide a staircase shaped portion of the redistribution layer including a plurality of steps each having a riser and a tread according to the present invention.

Finally, as shown in FIG. 3F, the sacrificial layer 30 (photoresist layer) is trimmed again so that the opening 32 has a cross-sectional area (defined at least by line A) that is greater the opening 32 shown in FIG. 3E. The exposed portion of the second passivation layer 18 is etched to provide in a forth tread and fifth riser and so that a via 33 is provided through the second passivation layer 18 down to the bond pad 14. A fifth tread 52 will be provided by the upper surface 52 of the second passivation layer 18.

The sacrificial layer 30 is removed and an electrically conductive redistribution layer 20 is deposited or formed over the second passivation layer 18 and over each riser and tread formed in the second passivation layer 18 so that the redistribution layer 20 is deposited on or makes electrical contact with the bond pad 14. The redistribution layer 20 includes a staircase shaped portion with plurality of risers 34', 38' 42', 46', 50' and treads 36', 40', 44', 48', 52' corresponding to each of the risers and treads formed in the second passivation layer 18. The redistribution layer 20 may be deposited by any of variety of methods including, but not limited to, sputtering, electroplating, or electroless plating. For a copper bond pad 16, preferably the redistribution layer includes aluminum, and most preferably aluminum and copper. The redistribution layer 20 preferably has a substantially uniform thickness due to the fact that the present method produces openings in the second passivation layer 18 that have an aspect ratio less than 1.

Figure 3H:
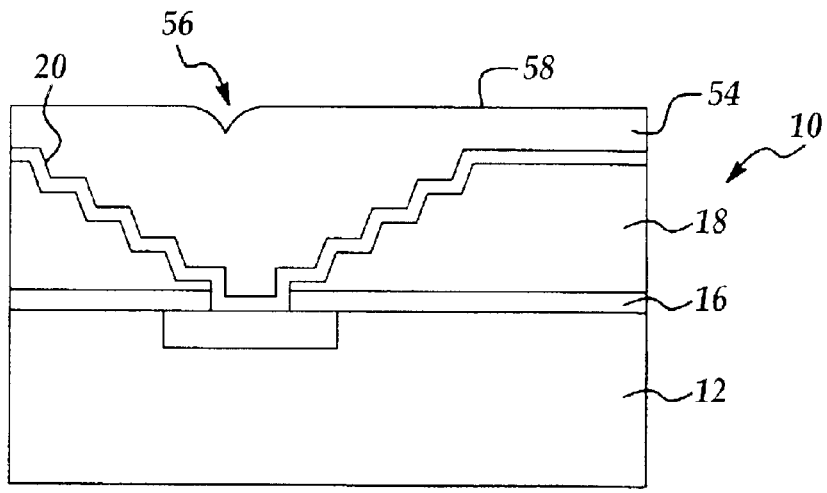
FIG. 3H illustrates depositing a third passivation layer over the redistribution layer according to the present invention.
Figure 3I:
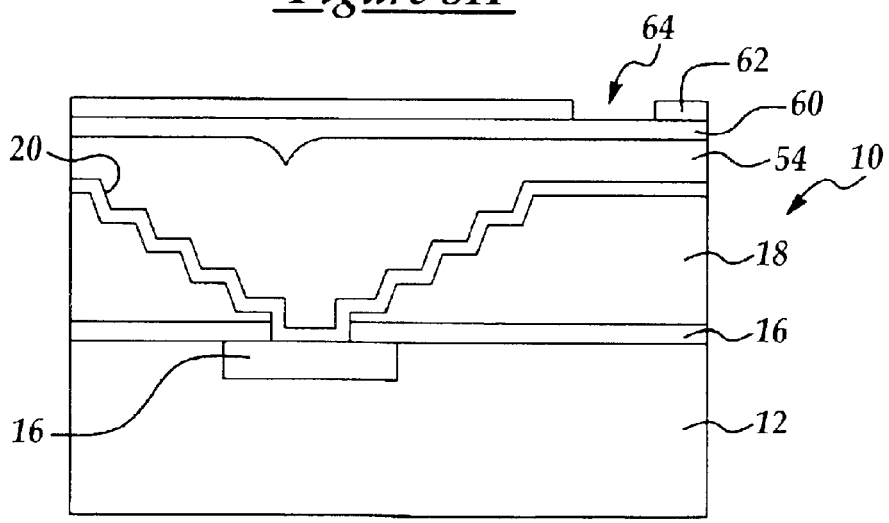
FIG. 3I illustrates depositing a planarization layer over the third passivation layer and forming a second sacrificial layer over the planarization layer and wherein the second sacrificial layer includes an opening therein according to the present invention.

Thereafter a third passivation layer 54 is deposited over the redistribution layer 20 as shown in FIG. 3H. Preferably the third passivation layer 54 is a silicon dioxide based layer. A slight recess 56 may develop in the upper surface 58 of the third passivation layer 54 due to the large via 33 defined in the second passivation layer 18. The third passivation layer 54 may be planarized by chemical mechanical planarization or a fourth passivation layer 60 may be deposited over the third passivation layer 54 as shown in FIG. 3I. Preferably the fourth passivation layer 60 is a polyamide material. A second sacrificial layer 62 may be formed over the fourth passivation layer 54 and an opening 64 defined therein. The opening 64 may be provided by patterning and developing a photoresist layer in a manner known to those skilled in the art.

Figure 3J:
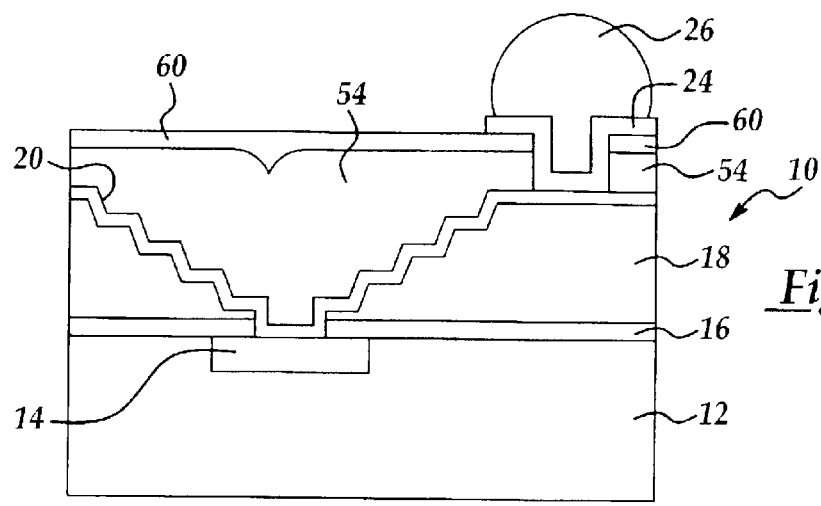
FIG. 3J illustrates forming a via through the planarization layer and the third passivation layer down to the redistribution layer and forming an under bump metallurgy in the via so that the under bump metallurgy is electrically connected to the redistribution layer and forming an electrically conductive bump over the under bump metallurgy according to the present invention.

As shown in FIG. 3J the exposed to portion of the microelectronic device 10 is etched so that a via is provided through the third and fourth passivation layers 54, 60 respectively down to the redistribution layer 20 and an under bump metallurgy 24 is deposited into the via down to the redistribution layer 20. The under bump metallurgy may be formed by any method known to those skilled in the art including, but not limited to, those methods described in the background of the invention. An electrically conductive material including, but not limited to, solder is deposited over the under bump metallurgy 24 in any manner and composition known to those skilled in the art including, but not limited to, those methods and material disclosed in the background of the invention. The electrically conductive material is reflown to provide an electrically conductive bump (preferably solder bump) 26 over the under bump metallurgy 24. Excess portions of the under bump metallurgy 24 may be removed by etching using the electrically conductive material as a mask.

What is claimed is:

1. A microelectronic device comprising:

a base substrate having a bond pad;

an electrically conductive redistribution layer having a first portion electrically connected to the bond pad and having a first staircase shaped portion adjacent from the bond pad, and wherein the first staircase shaped portion of the redistribution layer includes at, least a first, second and third step and the wherein each of the first, second and third stop includes a riser and a tread, the trend of each step being vertically displaced from the tread of each of the other steps in the first staircase shaped portion, and an electrically conductive bump electrically connected to a second portion of the redistribution layer, the second portion of the redistribution layer is vertically displaced from the first portion of the redistribution layer.

2. A microelectronic device as set forth in claim 1 further comprising a passivation layer overlying the base substrate and an opening formed in the passivation layer defined at least in part by a side wall having a second staircase shaped portion formed therein comprising at least a fourth and a fifth step immediately adjacent each other and wherein each of the fourth and fifth step comprises a riser and a tread, the trend of each step of the second staircase portion being vertically displaced from the tread of each other step in the second staircases portion.

3. A microelectronic device as set forth in claim 2 wherein the electrically conductive bump comprises a molder bump.

4. A microelectronic device as set forth in claim 2 wherein the second staircase portion further comprises a sixth step including a riser and a tread, and wherein the tread of the sixth step is vertically displaced from the tread of the fifth step, and wherein the redistribution layer includes a portion overlying the riser and tread of the sixth step.

5. A microelectronic device as set forth in claim 1 further comprising and under bump metallurgy interposed between the electrically conductive bump and the other portion of the redistribution layer.

6. A microelectronic device as set forth in claim 1 further comprising a passivation layer overlying the redistribution layer.

7. A microelectronic device as set forth in claim 6 wherein the passivation layer overlying the redistribution layer includes a recess therein, and further comprising a planarizing layer overlying the passivation layer overlying the redistribution layer.

8. A microelectronic device as set forth in claim 7 further comprising an electrically conductive bump electrically connected to another portion of the redistribution layer.

9. A microelectronic device as set forth in claim 8 further comprising an under bump metallurgy interposed between the electrically conductive bump and the other portion of the redistribution layer and the under bump metallurgy extending through the planarizing layer and the passivation layer overlying the redistribution layer.

* * * * *